United States Patent
Ngo et al.

(10) Patent No.: US 6,627,973 B1
(45) Date of Patent: Sep. 30, 2003

(54) VOID-FREE INTERLAYER DIELECTRIC (ILD0) FOR 0.18-MICRON FLASH MEMORY SEMICONDUCTOR DEVICE

(75) Inventors: Minh Van Ngo, Fremont, CA (US); Robert A. Huertas, Hollister, CA (US); Lu You, San Jose, CA (US); King Wai Kelwin Ko, San Jose, CA (US); Pei-Yuan Gao, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/244,129

(22) Filed: Sep. 13, 2002

Related U.S. Application Data

(62) Division of application No. 09/788,045, filed on Feb. 16, 2001, now Pat. No. 6,489,253.

(51) Int. Cl.$^7$ ............................................. H01L 29/167
(52) U.S. Cl. ...................... 257/607; 257/270; 257/272; 257/288; 257/408; 257/403; 257/430; 257/635; 438/197; 438/231; 438/232; 438/249
(58) Field of Search .................. 257/270, 272, 257/288, 408, 403, 430, 607, 635; 438/197, 231, 232, 249

(56) References Cited

U.S. PATENT DOCUMENTS

| | | | | |
|---|---|---|---|---|
| 4,996,167 A | * | 2/1991 | Chen ........................... | 438/279 |
| 5,480,822 A | * | 1/1996 | Hsue et al. .................. | 438/278 |
| 5,631,179 A | * | 5/1997 | Sung et al. .................. | 438/264 |
| 5,972,789 A | * | 10/1999 | Jeng et al. ................... | 438/637 |
| 6,469,339 B1 | * | 10/2002 | Onakado et al. ............. | 257/315 |
| 6,524,914 B1 | * | 2/2003 | He et al. ...................... | 438/264 |

* cited by examiner

*Primary Examiner*—Vinh P. Nguyen
*Assistant Examiner*—Lisa Kilday
(74) *Attorney, Agent, or Firm*—LaRiviere, Grubman & Payne, LLP

(57) ABSTRACT

A method of eliminating voids in the interlayer dielectric material of 0.18-$\mu$m flash memory semiconductor devices and a semiconductor device formed by the method. The present invention provides a method for eliminating voids in the interlayer dielectric of a 0.18-$\mu$m flash memory semiconductor device by providing a first BPTEOS layer, using a very low deposition rate and having a thickness in a range of approximately 3 kÅ; and providing a second BPTEOS layer, using a standard deposition rate and having a thickness in a range of approximately 13 kÅ, wherein both layers have an atomic dopant concentration of approximately 4.5% B and approximately 5% P. This two-step deposition process completely eliminates voids in the ILD for a 0.5-$\mu$m distance (gate-to-gate) as well as 0.38-$\mu$m distance (gate-to-gate) which is the future flash technology. A low dopant/TEOS flow performed at a higher pressure during the deposition of the first layer provides an excellent gap-filling capability which eliminates voiding. Further, the present invention has the advantage of in-situ deposition of the void-free ILD0 layer of the 0.18-$\mu$m flash memory semiconductor device having a sound dopant concentration.

15 Claims, 4 Drawing Sheets

VOID-FREE INTERLAYER DIELECTRIC (ILD0) FOR 0.18-MICRON FLASH MEMORY SEMICONDUCTOR DEVICE

CROSS-REFERENCE TO RELATED APPLICATION(S)

This application is a divisional application, claiming priority from copending U.S. patent application Ser. No. 09/788,045, also entitled "Method of Forming a Void-Free Interlayer Dielectric (ILD0) for 0.18-μm Flash Memory Technology and Semiconductor Device thereby Formed, filed Feb. 16, 2001 now U.S. Pat. No. 6,489,253.

FIELD OF THE INVENTION

The present invention relates to flash memory semiconductor devices. More particularly, the present invention relates to 0.18-μm flash memory semiconductor devices. Even more particularly, the present invention relates to eliminating voids in the interlayer dielectric material of 0.18-μm flash memory semiconductor devices.

BACKGROUND OF THE INVENTION

Currently, the semiconductor industry is experiencing shorting problems associated with the silicon (Si) of a CS59 0.18-mm flash memory technology device coming in contact with a tungsten plug due to void formation within the interlayer dielectric (ILD0) boron phosphorous tetraethylorthosilicate (BPTEOS) layer. Void formation has been found to be especially prevalent between drain contacts in related art devices. FIG. 1 is a scanning electron micrograph (SEM) of such a device, in cross-section, demonstrating such void 10 formation along a "word line" direction between the drain contacts 11, in accordance with the related art. FIG. 2 is another SEM illustrating, at higher magnification, a device cross-section in which a barrier metal deposition (BMD)/tungsten material 12 from a plug has extended into the voids 10 formed in the ILD, thereby shorting the neighboring drain contacts 11, as experienced in the related art devices. Although boron-phosphorous-silica (BP—SiO$_2$) films, having a relatively high density, have been deposited using a lower deposition rate, a method for forming BPTEOS films using a lower deposition rate has not been known to the Applicants before their invention. Therefore, a need exists for providing a method of eliminating voids in the interlayer dielectric material of 0.18-μm flash memory semiconductor devices and a device thereby formed.

BRIEF SUMMARY OF THE INVENTION

Accordingly, the present invention provides a method of eliminating voids in the interlayer dielectric material of 0.18-μm flash memory semiconductor devices and a voidless device thereby formed. More specifically, the present invention provides a method for eliminating voids in the interlayer dielectric material of a 0.18-μm flash memory semiconductor device by providing a first BPTEOS layer being formed by using a very low deposition rate and having a thickness in a range of approximately 3 kÅ; and providing a second BPTEOS layer being formed by using a standard deposition rate and having a thickness in a range of approximately 13 kÅ, wherein both layers have an atomic dopant concentration of approximately 4.5% boron (B) from triethylborate (TEB: C$_6$H$_{15}$O$_3$B) and approximately 5% phosphorous (P) from triethylphosphate (TEPO: C$_6$H$_{15}$O$_4$P).

This two-step deposition process completely eliminates voids in the ILD layer for a 0.5-μm distance (gate-to-gate) as well as 0.38-μm distance (gate-to-gate) which is the future flash technology. A low deposition rate such as 8±2 Å/sec is driven by a combination of low flow rates of the precursor materials of B and P dopants and tetraethyl orthosilicate (TEOS; i.e., Si(OC$_2$H$_5$)$_4$). Particularly, a low dopant/TEOS flow (e.g., TEB at 60 g/min±30%, TEPO at 30 g/min±30%, TEOS at 200 g/min±30%) performed at a higher pressure (e.g., 450±250 Torr) during the deposition of the first layer provides an excellent gap-filling capability which eliminates voiding. The second BPTEOS layer may be deposited at a higher deposition rate such as 100±10 Å/sec. Further, the present invention has the advantage of in-situ deposition of the void-free ILD0 layer of the 0.18-μm flash memory semiconductor device having a sound dopant concentration by preventing crystallization of boron phosphate (BPO$_4$) and maintaining the "C1" etch process using existing tools such as a heat lamp.

BRIEF DESCRIPTION OF THE DRAWING

For a better understanding of the present invention, reference is made to the below-referenced accompanying Drawing. Reference numbers refer to the same or equivalent parts of the present invention throughout the several figures of the Drawing.

DETAILED DESCRIPTION OF THE INVENTION

Figure 1:
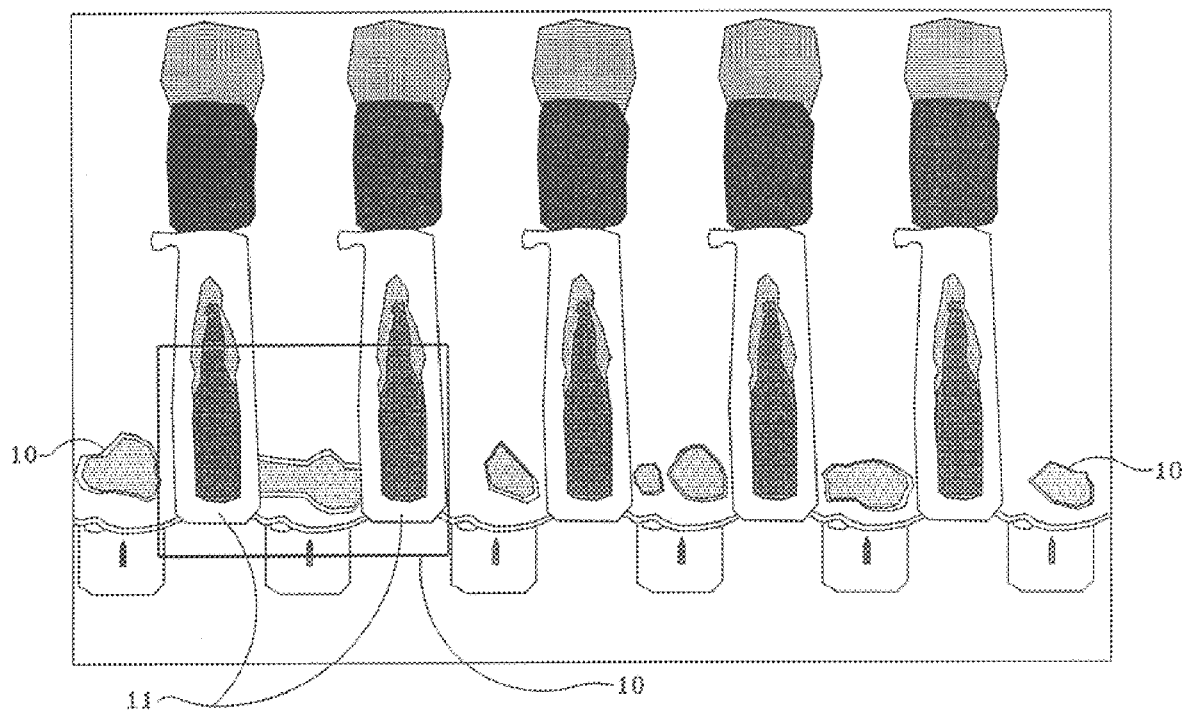
FIG. 1 is a schematic of a scanning electron micrograph (SEM) of a device, in cross-section, demonstrating such void formation along a "word line" direction between the drain contacts, in accordance with the related art.
Figure 2:
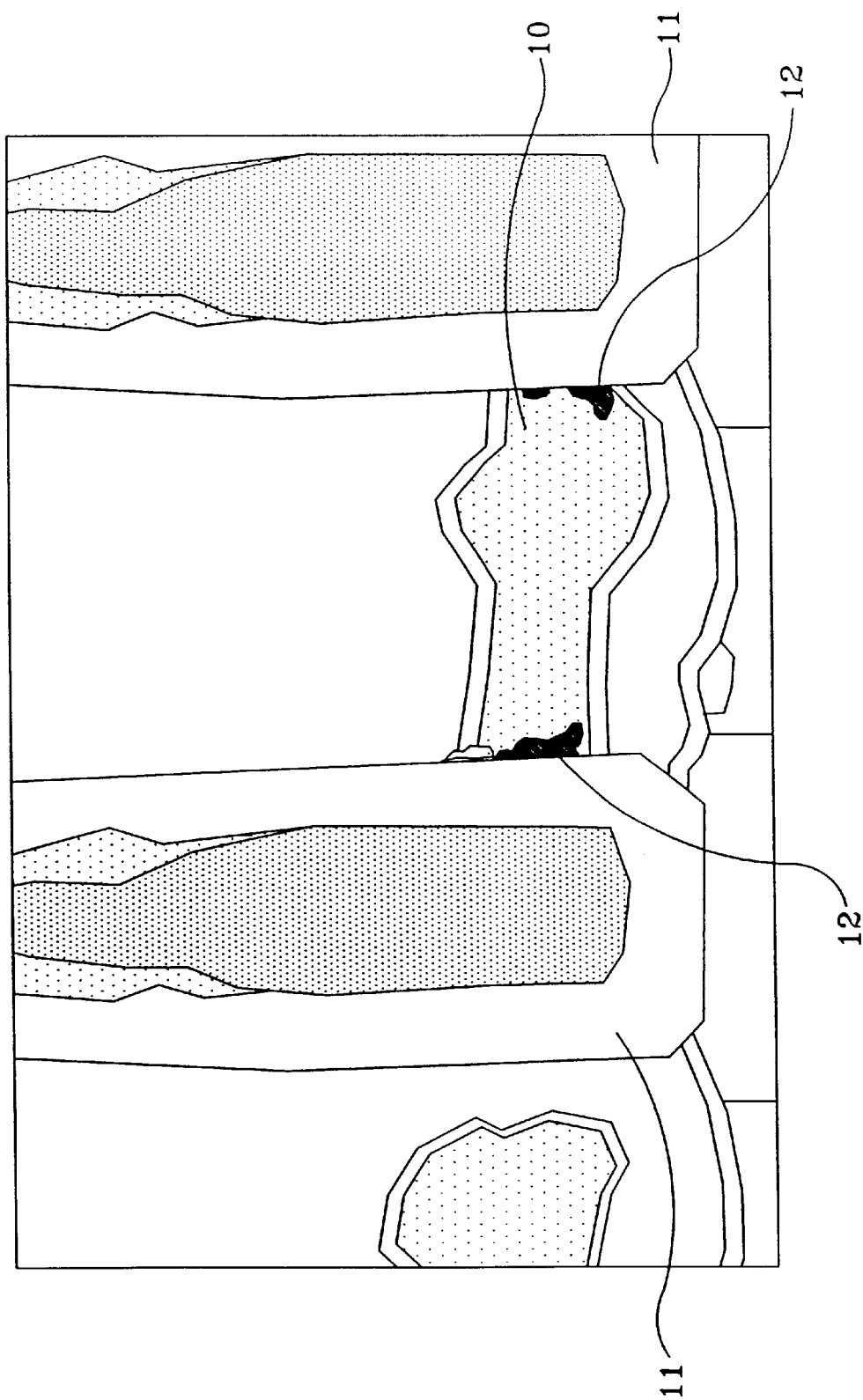
FIG. 2 is another schematic of a SEM illustrating, at higher magnification, a device of FIG. 1 in cross-section where a BMD/tungsten material has extended into the voids, thereby shorting the neighboring contacts, in accordance with the related art.
Figure 3:
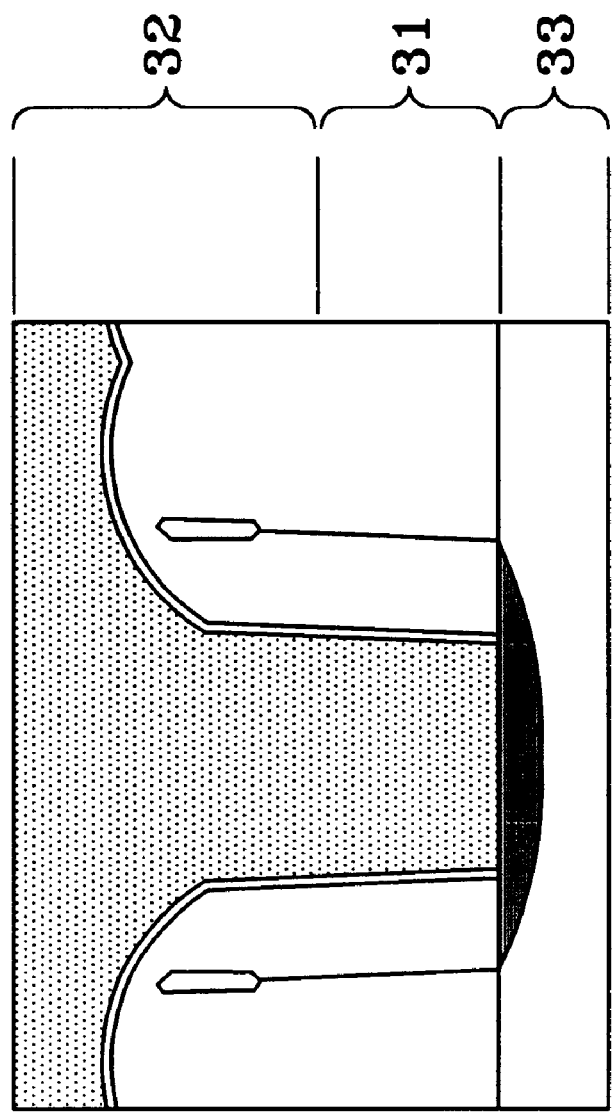
FIG. 3 is a schematic of a scanning electron micrograph (SEM) of a device, in cross-section, demonstrating no void formation, in accordance with the present invention.

FIG. 3 illustrates, in a schematic of a scanning electron micrograph (SEM), a device cross-section, having no void formation in its unique BPTEOS interlayer dielectric (ILD), comprising a first BPTEOS layer 31 being deposited on a silicon substrate 33; and a second BPTEOS layer 32 being deposited on the first BPTEOS layer 31, in accordance with the present invention.

Figure 4:
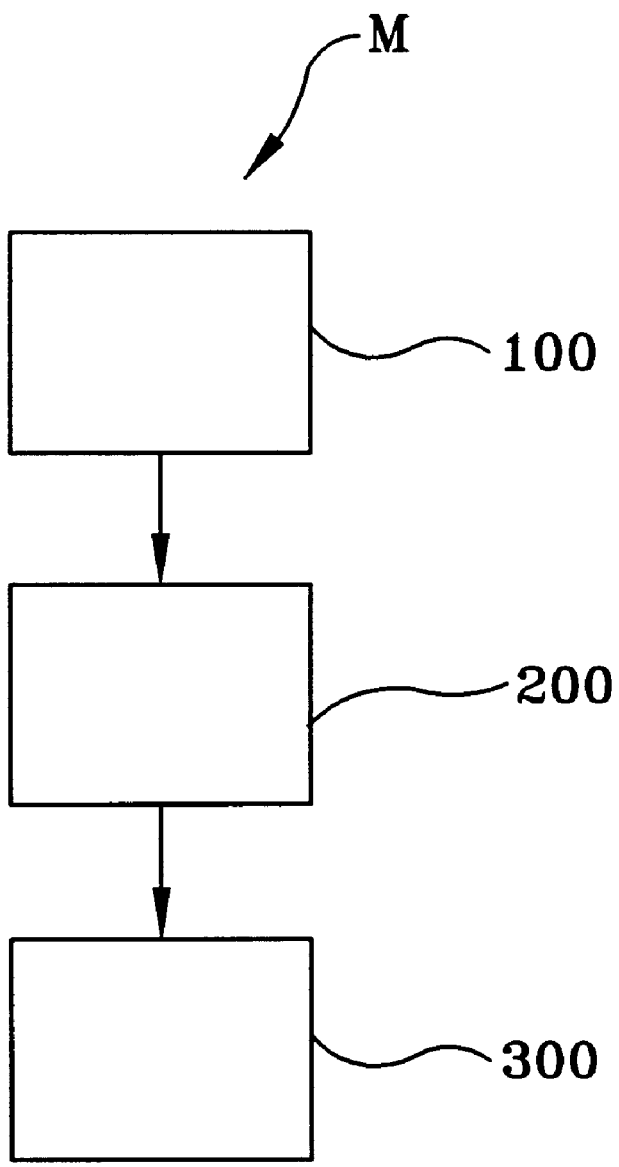
FIG. 4 is a flowchart of a method for fabricating a semiconductor device having a virtually void-free interlayer dielectric layer, in accordance with the present invention.

FIG. 4 flowcharts a method M for fabricating a semiconductor device having a virtually void-free interlayer dielectric layer, in accordance with the present invention. The method M of fabricating a 0.18-μm flash memory semiconductor device, having a virtually void-free interlayer dielectric, comprises the steps of: (A) depositing a first boron-phosphorous-tetraethyl-orthosilicate (BPTEOS) layer on a silicon substrate, the first and the second boron-phosphorous-tetraethyl-orthosilicate (BPTEOS) layer being formed from a group of reagents comprising a boron dopant, a phosphorous dopant, and TEOS, and the depositing step (A) comprises a first boron dopant flow rate, a first phosphorous dopant flow rate, and a first TEOS flow rate, as indicated by block 100; (B) depositing a second boron-phosphorous-tetraethyl-orthosilicate (BPTEOS) layer on the first BPTEOS layer, the second boron-phosphoroustetraethyl-orthosilicate (BPTEOS) layer being formed from a group of reagents comprising a boron dopant, a phosphorous dopant, and TEOS, and the depositing step (B) comprises a second boron dopant flow rate, a second phosphorous dopant flow rate, and a second TEOS flow rate, thereby forming the virtually void-free interlayer dielectric, as indicated by block 200; and (C) completing formation of the semiconductor device, thereby forming the 0.18-$\mu$m flash memory semiconductor device, having a virtually void-free interlayer dielectric, as indicted by block 300.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A 0.18-$\mu$m flash memory semiconductor device, having a virtually void-free interlayer dielectric, fabricated by the method comprising:

A. depositing a first boron-phosphorous-tetraethylorthosilicate (BPTEOS) layer on a silicon substrate, the first boron-phosphorous-tetraethyl-orthosilicate (BPTEOS) layer being formed from a group of reagents comprising a boron dopant, a phosphorous dopant, and tetraethyl orthosilicate (TEOS), and the depositing step (A) comprises a first boron dopant flow rate, a first phosphorous dopant flow rate, and a first TEOS flow rate, the depositing step (A) being performed at a low deposition rate of approximately 8±2 Å/sec, thereby gap-filling, and thereby eliminating voids;

B. depositing a second boron-phosphorous-tetraethyl orthosilicate (BPTEOS) layer on the first BPTEOS layer, the second boron-phosphorous-tetraethyl-orthosilicate (BPTEOS) layer being formed from a group of reagents comprising a boron dopant, a phosphorous dopant, and TEOS, and the depositing step (B) comprises a second boron dopant flow rate, a second phosphorous dopant flow rate, and a second TEOS flow rate, thereby forming the virtually void-free interlayer dielectric; and C. completing formation of the semiconductor device, thereby forming the 0.18-$\mu$m flash memory semiconductor device, having a virtually void-free interlayer dielectric.

2. A device, as recited in claim 1, wherein the first BPTEOS layer has a thickness in a range of approximately 3 kÅ, and wherein the second BPTEOS layer has a thickness in a range of approximately 13 kÅ.

3. A device, as recited in claim 1, wherein the first BPTEOS layer has an atomic dopant concentration of approximately 4.5% boron (B) and approximately 5% phosphorous (P), and wherein the second BPTEOS layer has an atomic dopant concentration of approximately 4.5% boron (B) and approximately 5% phosphorous (P).

4. A device, as recited in claim 1, wherein the device has a gate-to-gate distance in a range of 0.38-$\mu$m to 0.5-$\mu$m.

5. A device, as recited in claim 1, wherein the boron dopant comprises triethylborate (TEB: $C_6H_{15}O_3B$), and wherein the phosphorous dopant comprises triethylphosphate (TEPO: $C_6H_{15}O_4P$).

6. A device, as recited in claim 1, wherein the first boron dopant (TEB) flow rate is approximately 60 g/min±30%, wherein the first phosphorous dopant (TEPO) flow rate is approximately 30 g/min±30%, and wherein the first TEOS flow rate is approximately 200 g/min±30%.

7. A device, as recited in claim 1, wherein the depositing step (A) is performed at a higher pressure of approximately 450±250 Torr, thereby eliminating voids.

8. A device, as recited in claim 1, wherein the depositing steps (A) and (B) are performed using a set of relative parameters selected from a group consisting essentially of:

(1) the depositing step (A) being performed at said low deposition rate of approximately 8±2 Å/sec, thereby gap-filling, and thereby eliminating voids, and the depositing step (B) being performed at a higher deposition rate of approximately 100±10 Å/sec, and (2) the depositing step (A) being performed at said low deposition rate of approximately 8±2 Å/sec, thereby gap-filling, and thereby eliminating voids, and the depositing step (B) also being performed at a low deposition rate of approximately 8±2 Å/sec.

9. A device, as recited in claim 1, wherein the device is free from boron phosphate ($BPO_4$) crystallization.

10. A 0.18-$\mu$m flash memory semiconductor device, having a virtually void-free interlayer dielectric, formed by a method comprising:

A. depositing a first boron-phosphorous-tetraethyl orthosilicate (BPTEOS) layer on a silicon substrate, the first and the second boron-phosphorous-tetraethyl-orthosilicate (BPTEOS) layer being formed from a group of reagents comprising a boron dopant, a phosphorous dopant, and tetraethyl orthosilicate (TEOS), and the depositing step (A) comprises a first boron dopant flow rate, a first phosphorous dopant flow rate, and a first TEOS flow rate, and the depositing step (A) being performed at a low deposition rate of approximately 8±2 Å/sec, thereby gap-filling, and thereby eliminating voids;

B. depositing a second boron-phosphorous-tetraethyl-orthosilicate (BPTEOS) layer on the first BPTEOS layer, the second boron-phosphorous-tetraethyl-orthosilicate (BPTEOS) layer being formed from a group of reagents comprising a boron dopant, a phosphorous dopant, and TEOS, and the depositing step (B) comprises a second boron dopant flow rate, a second phosphorous dopant flow rate, and a second TEOS flow rate, thereby forming the virtually void-free interlayer dielectric; and C. completing formation of the semiconductor device, thereby forming the 0.18-μm flash memory semiconductor device, having a virtually void-free interlayer dielectric, wherein the first BPTEOS layer has a thickness in a range of approximately 3 kÅ, wherein the second BPTEOS layer has a thickness in a range of approximately 13 kÅ, wherein the first BPTEOS layer has an atomic dopant concentration of approximately 4.5% boron (B) and approximately 5% phosphorous (P), wherein the second BPTEOS layer has an atomic dopant concentration of approximately 4.5% boron (B) and approximately 5% phosphorous (P), wherein the device has a gate-to-gate distance in a range of 0.38-μm to 0.5-μm, wherein the boron dopant comprises triethylborate (TEB: $C_6H_{15}O_3B$), wherein the phosphorous dopant comprises triethylphosphate (TEPO: $C_6H_{15}O_4P$), wherein the first boron dopant (TEB) flow rate is approximately 60 g/min±30%, wherein the first phosphorous dopant (TEPO) flow rate is approximately 30 g/min±30%, wherein the first TEOS flow rate is approximately 200 g/min±30%, wherein the depositing step (A) is performed at a higher pressure of approximately 450±250 Torr, wherein the depositing steps (A) and (B) are performed using a set of relative parameters selected from a group consisting essentially of:

(1) the depositing step (A) being performed at said low deposition rate of approximately 8±2 Å/sec, thereby gap-filling, and thereby eliminating voids, and the depositing step (B) being performed at a higher deposition rate of approximately 100±10 Å/sec, and (2) the depositing step (A) being performed at said low deposition rate of approximately 8±2 Å/sec, thereby gap-filling, and thereby eliminating voids, and the depositing step (B) also being performed at a low deposition rate of approximately 8±2 Å/sec, and wherein the device is free from boron phosphate ($BPO_4$) crystallization.

11. A 0.18-μm flash memory semiconductor device, having a virtually void-free interlayer dielectric, comprising:

A. a first boron-phosphorous-tetraethylorthosilicate (BPTEOS) layer deposited on a silicon substrate, the first boron-phosphorous-tetraethyl-orthosilicate (BPTEOS) layer comprising a boron dopant, a phosphorous dopant, and tetraethyl orthosilicate (TEOS), and the first boron-phosphorous-tetraethyl-orthosilicate (BPTEOS) layer being gap-filled;

B. a second boron-phosphorous-tetraethyl orthosilicate (BPTEOS) layer deposited on the first BPTEOS layer, the second boron-phosphorous-tetraethyl-orthosilicate (BPTEOS) layer comprising a boron dopant, a phosphorous dopant, and TEOS, and the second boron-phosphorous-tetraethyl-orthosilicate (BPTEOS) layer and the first boron-phosphorous-tetraethyl-orthosilicate (BPTEOS) layer together comprising the virtually void-free interlayer dielectric, wherein the first BPTEOS layer has a thickness in a range of approximately 3 kÅ, wherein the second BPTEOS layer has a thickness in a range of approximately 13 kÅ, wherein the first BPTEOS layer has an atomic dopant concentration of approximately 4.5% boron (B) and approximately 5% phosphorous (P), wherein the second BPTEOS layer has an atomic dopant concentration of approximately 4.5% boron (B) and approximately 5% phosphorous (P), wherein the device has a gate-to-gate distance in a range of 0.38-μm to 0.5-μm, wherein the boron dopant comprises triethylborate (TEB: $C_6H_{15}O_3B$), wherein the phosphorous dopant comprises triethylphosphate (TEPO: $C_6H_{15}O_4P$), and wherein the device is free from boron phosphate ($BPO_4$) crystallization.

12. A device, as recited in claim 11, wherein the first boron dopant (TEB) comprises a flow rate in a range of approximately 60 g/min±30%, wherein the first phosphorous dopant (TEPO) comprises a flow rate in a range of approximately 30 g/min±30%, and wherein the first TEOS comprises a flow rate in a range of approximately 200 g/min±30%.

13. A device, as recited in claim 11, wherein the first BPTEOS layer is formed at a higher pressure of approximately 450±250 Torr, thereby eliminating voids.

14. A device, as recited in claim 11, wherein the first BPTEOS layer and the second BPTEOS layer are formed using a set of relative parameters selected from a group consisting essentially of:

(1) the first BPTEOS layer being formed at a low deposition rate of approximately 8±2 Å/sec, thereby gap-filling, and thereby eliminating voids, and the second BPTEOS layer being formed at a higher deposition rate of approximately 100±10 Å/sec, and (2) the first BPTEOS layer being formed at a low deposition rate of approximately 8±2 Å/sec, thereby gap-filling, and thereby eliminating voids, and the second BPTEOS layer also being formed at a low deposition rate of approximately 8±2 Å/sec.

15. A device, as recited in claim 11, wherein the device is free from boron phosphate ($BPO_4$) crystallization.

* * * * *